United States Patent
Clifton et al.

(10) Patent No.: US 7,700,416 B1
(45) Date of Patent: Apr. 20, 2010

(54) TENSILE STRAINED SEMICONDUCTOR ON INSULATOR USING ELASTIC EDGE RELAXATION AND A SACRIFICIAL STRESSOR LAYER

(75) Inventors: Paul A. Clifton, Mountain View, CA (US); Daniel J. Connelly, San Francisco, CA (US); R. Stockton Gaines, Pacific Palisades, CA (US)

(73) Assignee: Acorn Technologies, Inc., Santa Monica, CA (US)

( * ) Notice: Subject to any disclaimer, the term of this patent is extended or adjusted under 35 U.S.C. 154(b) by 0 days.

(21) Appl. No.: 12/110,030

(22) Filed: Apr. 25, 2008

(51) Int. Cl.
*H01L 21/335* (2006.01)
(52) U.S. Cl. .................. 438/142; 438/938; 257/347; 257/190; 257/E29.193
(58) Field of Classification Search .............. 438/938; 257/347, 190
See application file for complete search history.

(56) References Cited

U.S. PATENT DOCUMENTS

| | | |
|---|---|---|
| 4,994,866 A | 2/1991 | Awano |
| 5,734,598 A | 3/1998 | Abbott et al. |
| 6,175,588 B1 | 1/2001 | Viscotsky et al. |
| 6,406,973 B1 | 6/2002 | Lee |
| 6,492,216 B1 | 12/2002 | Yeo et al. |
| 6,498,359 B2 | 12/2002 | Schmidt et al. |
| 6,600,170 B1 | 7/2003 | Xiang |
| 6,881,635 B1 | 4/2005 | Chidambarrao et al. |
| 7,019,326 B2 | 3/2006 | Cea et al. |
| 7,202,513 B1 * | 4/2007 | Chidambarrao et al. ..... 257/190 |
| 2002/0065664 A1 | 5/2002 | Witzgall et al. |
| 2002/0136277 A1 | 9/2002 | Reed et al. |
| 2002/0152253 A1 | 10/2002 | Ricks et al. |

(Continued)

FOREIGN PATENT DOCUMENTS

EP    1 231 643 A2    8/2002

(Continued)

OTHER PUBLICATIONS

J. S. Goldstein, I. S. Reed and L. L. Schart, A Multistage Representation of the Wiener filter Based on Orthogonal Projections, IEEE Transactions on Information Theory, vol. 44, No. 7, Nov. 1998.

(Continued)

*Primary Examiner*—Ha Tran T Nguyen
*Assistant Examiner*—Aaron A Dehne
(74) *Attorney, Agent, or Firm*—Orrick, Herrington & Sutcliffe, LLP

(57) ABSTRACT

The process uses a sacrificial stressor layer to provide tensile strained surface regions for bulk silicon or silicon on insulator (SOI) substrates. The process deposits a sacrificial layer of silicon germanium on the surface of the substrate and then patterns the workpiece to form trenches extending through the silicon germanium stressor layer into the semiconductor substrate. The process fills the trenches with insulating materials and then removes the silicon germanium stressor layer, for example using wet etching, leaving a strained silicon or SOI substrate with a pattern of shallow trench isolation structures. The trench fill material is selected to stress the regions of silicon between the trenches to provide a tensile strained surface region to the semiconductor substrate. Such a strained semiconductor surface region can have improved mobility properties and so is advantageous for forming devices such as MOSFETs.

36 Claims, 3 Drawing Sheets

U.S. PATENT DOCUMENTS

| | | | |
|---|---|---|---|
| 2002/0191568 A1 | 12/2002 | Ghosh | |
| 2003/0227886 A1 | 12/2003 | Farrokh et al. | |
| 2004/0021179 A1 | 2/2004 | Lee et al. | |
| 2004/0026765 A1 | 2/2004 | Currie et al. | |
| 2005/0093021 A1 | 5/2005 | Ouyang et al. | |
| 2005/0106792 A1 | 5/2005 | Cea et al. | |
| 2005/0133817 A1 | 6/2005 | Huang et al. | |
| 2005/0255667 A1* | 11/2005 | Arghavani et al. | 438/405 |
| 2006/0081837 A1* | 4/2006 | Bedell et al. | 257/19 |
| 2006/0081839 A1* | 4/2006 | Jeong et al. | 257/40 |

FOREIGN PATENT DOCUMENTS

| | | |
|---|---|---|
| EP | 1 231 643 A3 | 6/2004 |
| WO | WO 00/67389 A | 11/2000 |
| WO | PCT/US03/10180 | 7/2003 |
| WO | WO 03/085830 A | 10/2003 |
| WO | PCT/US2005/025335 | 8/2006 |
| WO | PCT/US2007/006171 | 9/2007 |

OTHER PUBLICATIONS

M. L. Honig and J. S. Goldstein, "Adaptive Reduced-Rank Residual Correlation Algorithms for DS-CDMA Interference Suppression," In Proc. 32th Asilomar Conference Signals, Systems and Computer, Pacific Grove, CA, Nov. 1998.

D. C. Ricks and J. S. Goldstein, "Efficient Architectures for Implementing Adaptive Algorithms," Proceedings of the 2000 Antenna applications Symposium, Allerton Park, Monticello, IL., Sep. 20-22, 2000.

J. S. Goldstein and I. S. Reed, "Reduced-Rank Adaptive Filtering," IEEE Transactions on Signal Processing, vol. 45, No. 2, Feb. 1997.

M. L. Honig and W. Xiao, "Performance of Reduced Rank Linear Interference," work supported by U. S. Army Research office under grant DAAH04-96-I-0378, Jan. 2001.

D. C. Ricks, P. G. Cifuentes and J. S. Goldstein, "What is Optimal Processing for Nonstationary Data?" Conference Record of the Thirty Fourth Annual Asilomar Conference on Signals, Systems and Computers, Pacific Grove California, Oct. 29-Nov. 2, 2002.

J. S. Goldstein and I. S. Reed, "Performance measures for Optimal Constrained Beamformers," IEEE Transactions on Antennas and Propagation, vol. 45, No. 1, Jan. 1997.

J. S. Goldstein, I. S. Reed, and R. N. Smith, "Low-Complexity Subspace Selection for Partial Adaptivity", Proceedings of IEE Milcom, Oct. 1996.

W. L. Myrick, M. D. Zoltowski and J. S. Goldstein, "Low-Sample Performance of Reduced-Rank Power Minimization Based Jammer Suppression for GPS," IEEE $6^{th}$ International Symposium Tech. & Appli., NJIT, New Jersey, Sep. 6-8, 2000.

W. Chen, U. Mitra and P. Schniter, "Reduced Rank Detection Schemes for DS-CDMA Communication Systems," private communication, Jan. 2002.

J. Scott Goldstein, et al., "A New Method of Wiener Filtering and its Application to Interference Mitigation for Communications," IEEE, pp. 1087-1091, 1997.

Colin D. Frank, et al. "Adaptive Interference Suppression for the Downlink of a Direct Sequence CDMS System with Long Spreading Sequences," Part of work was presented at the $36^{th}$ Annual Allerton Conference on Communication, Control and Computing, Monticello, Illinois, pp. 1-31, Sep. 1998.

Samina Chowdhury, et al. "Reduced-Rank Chip-level MMSE Equalization for the 3G CDMA Forward Link with Code-Multiplexed Pilot," Invited Paper for Special Issue of EURASIP Journal on Applied Signal Processing, pp. 1-27, Jul. 2001.

Belkacem Mouhouche, et al., "Chip-Level MMSE Equalization in the Forward Link of UMTS-FDD: A Low Complexity Approach," IEEE, pp. 1015-1019, 2003.

M. Joham, et al. "A New Backward Recursion for the Multi-Stage Nested Wiener Filter Employing Krylov Subspace Methods," pp. 1-4.

Michael L. Honig, "Adaptive Reduced-Rank Interference Suppression Based on the Multistage Wiener Filter," IEEE Transactions on Communications, vol. 50, No. 6, pp. 986-994, Jun. 2002.

S.C. Jain, H.E. Maes, K. Pinardi, and I. De Wolf, "Stresses and Strains in Lattice-Mismatched Stripes, Quantum Wires, Quantum Dots, and Substrates in Si Technology", American Institute of Physics. 79 (11), Jun. 1, 1996.

H. Yin, K.D. Hobart and F.J. Kub, S.R. Shieh and T.S. Duffy, J.C. Sturm, "Strain Partition of Si/SiGe and $SiO_2$/SiGe on Compliant Substrates," American Institute of Physics, Appl. Phys., Jun. 2, 2003.

A. Fisher and H. Richter, "Elastic Misfit Stress Relaxation in Heteroepitaxial SiGe/Si Mesa Structures," 1992 American Institute of Physics, Appl. Phys. Lett 61 (22), Nov. 30, 1992.

Hirohisa Kawasaki, et al., "Impact of Parasitic Resistance and Silicon Layer Thickness Scaling for Strained-Silicon MOSFETs on Relaxed $Si_{1-x}Ge_x$ Virtual Substrate,", 2004 IEEE.

* cited by examiner

TENSILE STRAINED SEMICONDUCTOR ON INSULATOR USING ELASTIC EDGE RELAXATION AND A SACRIFICIAL STRESSOR LAYER

FIELD OF THE INVENTION

The present invention relates to strained semiconductor devices that incorporate strained active layers. The invention also relates to methods of making strained semiconductor devices using a sacrificial stressor layer.

DESCRIPTION OF THE RELATED ART

Strained silicon is widely viewed as an important technology for obtaining desired advancements in integrated circuit performance. Mobility enhancement results from a combination of reduced effective carrier mass and reduced intervalley (phonon) scattering. For MOS field effect transistors (MOSFETs) fabricated on conventional {100} oriented Si substrates with conduction primarily along <110> crystal axes, n-channel MOSFETs achieve improved performance with induced biaxial tensile stress in the top silicon layer along both the width and length axes of the active area. p-channel MOSFETs exhibit improved performance with induced uniaxial tensile stress in the top silicon layer along the width axis only (transverse tensile stress). p-channel MOSFETs also exhibit improved performance with induced uniaxial compressive stress in the top silicon layer along the length axis only (longitudinal compressive stress). Compressive stress can be provided selectively in a silicon surface layer, for example, by using recessed selective epitaxial SiGe stressors in the source and drain regions of a MOSFET to induce a desired compressive stress along the length axis (longitudinal).

Strained silicon is conventionally obtained by first growing a thick layer of silicon germanium alloy (SiGe) on a silicon substrate. The SiGe layer is grown to a sufficient thickness that the SiGe layer is relaxed to an unstrained condition at its surface. The in-plane lattice parameter of the SiGe surface is similar to that of a bulk crystal of SiGe of the same composition. SiGe alloys have larger lattice parameters than silicon. Hence the relaxed surface of the SiGe layer provides an in-plane lattice parameter larger than that of silicon. A subsequent thin layer of silicon is grown epitaxially on the relaxed surface of the SiGe layer. The thin epitaxial layer of silicon assumes the larger in-plane lattice parameter of the SiGe and grows in a strained state with bonds in the crystal lattice elongated in the growth plane. This approach, sometimes known as substrate-strained silicon or "virtual substrate" technology, grows a thin pseudomorphic layer of silicon on the relaxed surface of a SiGe layer.

So long as the strained silicon layer does not exceed a "critical thickness" for strain relaxation and some care is taken, the tensile strain is maintained in the strained silicon layer throughout the various implantation and thermal processing steps typical of CMOS manufacturing.

The use of a relaxed SiGe layer as a "virtual substrate" to strain a subsequently deposited epitaxial silicon layer inevitably requires acceptance of a very high dislocation density in the SiGe layer because the SiGe relaxation mechanism is plastic in nature. In other words, relaxation in the SiGe layer occurs through the generation of strain-relieving misfit dislocations. A SiGe layer thinner than the critical thickness on a silicon substrate is not relaxed and exhibits few misfit dislocations. If the SiGe layer is thicker than the critical thickness, the strained lattice undergoes plastic deformation and the stress is relieved by the nucleation and propagation of misfit dislocations. Some fraction of misfit dislocations give rise to threading dislocations (at least $10^4$-$10^5$ cm$^{-2}$) which propagate through the overlying strained silicon layer. Threading dislocations represent extended defects and give rise to multiple undesirable consequences in MOSFETs including source/drain junction leakage, reduction of channel mobility, variability of threshold voltage and enhanced diffusion paths leading to potential drain-to-source shorting in short-channel MOSFETs.

Silicon-on-insulator ("SOI") wafers, or more generally, semiconductor-on-insulator wafers, afford certain advantages over conventional bulk silicon (or other semiconductor) wafers and are gaining in importance in CMOS manufacturing. An SOI wafer may, for example, have a layer of silicon on top of a layer of insulator. In silicon-on-sapphire (SOS) technology, the insulator is a wafer of sapphire (crystalline aluminum oxide). Commercial exploitation of SOS is rather limited due to high wafer costs, limited wafer diameters and supply. SOI with a buried oxide (BOX) layer between the top (active) silicon layer and an underlying crystalline silicon host wafer is the preferred SOI configuration for CMOS applications. The BOX layer may be formed by high dose implantation of oxygen and annealing (accomplished, for example, using the so-called SIMOX process). The BOX layer may also be formed by a wafer bonding method (accomplished, for example, using the so-called Smart Cut process). In this method, an oxide film is formed on at least one of two silicon wafers. Hydrogen or rare gas ions are implanted into the upper surface of one of the wafers to form a fine bubble layer within the wafer. The ion-implanted silicon wafer is superposed on the other silicon wafer such that the ion-implanted surface comes into close contact with the other silicon wafer via the oxide film. The method then heats the wafers to delaminate a portion of one of the wafers using the fine bubble layer as a delaminating plane to form a thin film. A further heat treatment firmly bonds the remaining wafer portions to provide an SOI wafer. An example of a process that forms buried oxide layers by this method is described in U.S. Pat. No. 6,372,609. Wafers manufactured according to the Smart Cut process are commercially available from Soitec, Inc., of Bernin, France.

If the silicon layer on top of the BOX is thicker than approximately 50 nm, the silicon layer will not be fully depleted in normal operation of CMOS transistors. Such wafers are known as partially-depleted SOI. If the silicon layer on top of the BOX is thinner than approximately 50 nm, the silicon layer will be fully depleted in normal operation of CMOS transistors and such wafers are known as fully-depleted SOI (also known as ultra-thin body SOI).

SUMMARY OF THE PREFERRED EMBODIMENTS

Aspects of the present invention provide a method of manufacturing a semiconductor device comprising providing a substrate having a semiconductor surface layer and forming a sacrificial stressor layer over the semiconductor surface layer. The sacrificial stressor layer is formed in a stressed state in comparison to the semiconductor surface layer. Trenches are etched through the sacrificial stressor layer and through the semiconductor surface layer so that stress is transferred from a patterned region of the sacrificial stressor layer to a corresponding patterned region of the semiconductor surface layer to provide a strained semiconductor surface region defined laterally on at least two sides by trench walls. The method continues by filling the trenches to maintain at least a portion of the transferred stress within the strained semiconductor surface region and by removing remaining portions of the sacrificial stressor layer after the filling.

DETAILED DESCRIPTION OF THE PREFERRED EMBODIMENTS

Figure 1:
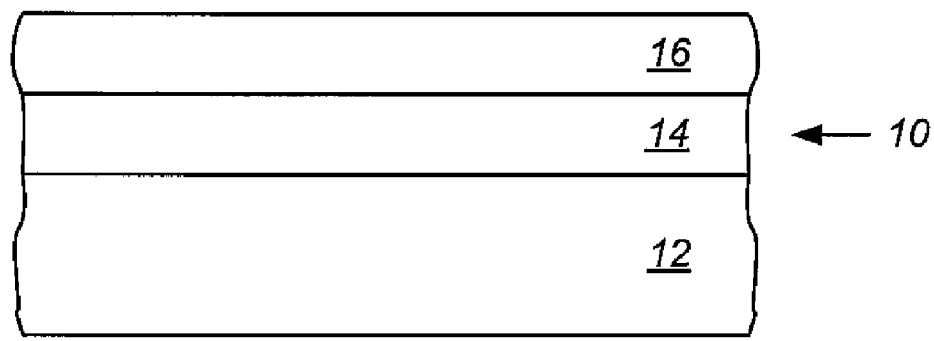
FIGS. 1-5 illustrate processes according to aspects of the present invention for forming a strained silicon surface region.

A preferred implementation of the present invention forms a sacrificial stressor layer over a semiconductor substrate so that the stressor layer can apply a lateral stress to a semiconductor surface portion of the substrate. One example of a suitable stressor layer is epitaxial silicon germanium. Another example might be silicon nitride deposited in an appropriately stressed state, which might be tensile or compressive for different applications. A suitable substrate might be a silicon wafer or a silicon on insulator (SOT) substrate. Other semiconductors may be used as the substrate in different applications. This example may then pattern the workpiece to form trenches that extend through the stressor layer and continue into the semiconductor substrate. The process fills the trenches and preferably removes the stressor layer, leaving a semiconductor substrate with a pattern of filled trenches extending into the surface of the substrate and the strain induced in the semiconductor surface portion maintained by the trench fill material. Such a strained semiconductor surface region can have improved mobility properties and so is advantageous for forming devices such as MOSFETs.

This discussion uses the term sacrificial stressor layer to identify a layer of material provided over a semiconductor substrate so that the stressor layer can be used to stress a surface region of the semiconductor substrate. Preferably the stressor layer is removed following transfer of at least a portion of the stress from the stressor layer to an underlying layer, so that the stressor layer is appropriately considered a sacrificial layer. Preferred implementations of the present invention use a sacrificial stressor layer in combination with a strategy for maintaining some portion of the stress applied by the sacrificial stressor layer after the sacrificial stressor layer is removed.

A more specific process implementation uses an epitaxial silicon germanium layer as the sacrificial stressor layer on either a bulk silicon substrate or a silicon on insulator (SOI) substrate. A chemical vapor deposition or equivalent process deposits a sacrificial layer of epitaxial silicon germanium on the surface of the substrate and then patterns the resulting workpiece to form trenches extending through the silicon germanium stressor layer into the semiconductor substrate. As a specific example, the sacrificial stressor layer may be silicon germanium with a germanium composition of about 25% deposited by chemical vapor deposition (CVD) on the surface of a bulk silicon or an SOI substrate. The silicon germanium sacrificial layer is compressively stressed as it is deposited and the surface of the substrate is not significantly stressed at this stage.

Following deposition of the sacrificial surface layer, preferred implementations then pattern both the sacrificial surface layer and the surface layer of the substrate to form trenches. Most preferably, the trenches extend into the buried insulator of the SOI substrate, when an SOI substrate is used. If the buried insulator is sufficiently thin in comparison to the thickness of the surface layer of the substrate in that case, it may be preferred that these trenches additionally extend into the substrate below the insulator for SOI substrate implementations. Trench formation allows the strain in the sacrificial silicon germanium layer to relax elastically, without generation of misfit dislocations, and the surface layer of the substrate to become strained from the lattice mismatch with the sacrificial silicon germanium layer. A preferred process fills the trenches with insulating material and follows the filling process with a chemical mechanical polishing (CMP) process to remove excess fill material. The chemical mechanical polishing may or may not remove a portion of the silicon germanium layer. Processing continues to remove the silicon germanium stressor layer, for example using wet etching, leaving a strained bulk silicon or SOI substrate with a pattern of trench isolation structures. Processing continues to form MOS field effect transistors or other devices with channels or active regions formed in the strained semiconductor surface region.

It is generally desirable that the trenches formed in such a process implementation of the present invention to be at least lined with an insulating layer so that the trenches become trench isolation structures for completed devices. Typically the trenches are completely filled with an insulator that may include different layers of insulating materials. For a silicon surface region of a bulk silicon or silicon on insulator substrate, trench isolation structures are filled by depositing one or more layers of silicon oxide and/or silicon nitride prior to removing the sacrificial stressor layer. Materials for filling the trenches are preferably selected to maintain the strain in the surface layer created by the sacrificial stressor layer.

Particularly preferred process aspects of the invention may use filled trench structures or another strategy to stabilize stress transferred from the sacrificial stressor layer to the underlying surface region or layer so that the transferred stress remains after the sacrificial stressor layer is removed from the structure. When the sacrificial stressor layer is formed on the substrate, the stressor layer may be deposited in a state of compressive stress. Etching trenches through the sacrificial stressor layer into the substrate relaxes the stress through edge relaxation and transfers the stress to the surface of the underlying silicon regions. This disclosure incorporates by reference the text and teachings of U.S. Pat. No. 7,338,834, entitled "Strained Silicon with Elastic Edge Relaxation," in its entirety. U.S. Pat. No. 7,338,834 discusses elastic edge relaxation and its use in effectively creating strained silicon regions and the patent is specifically incorporated in its entirety for its teachings with respect to stress relaxation and forming strained regions of a material. Some preferred embodiments of the invention use SOT substrates having buried insulator layers and etch trenches to the depth of or through the buried insulator layer. Etching trenches to this depth is particularly preferred because it allows more complete relaxation and more complete stress transfer because the buried insulator layer is more compliant as compared to silicon.

Aspects of the present invention are advantageously implemented with semiconductor on insulator substrates, including when the buried insulating layer is not stressed or, more generally, not intentionally stressed. At the present time, a preferred SOT substrate for the SOT processes described here is a typical commercially available silicon on insulator SOT wafer where the buried insulator is an oxide and generally is not required to have a specific level of engineered stress. Such processes deposit a sacrificial stressor layer on the silicon surface then etch trenches sufficiently deep into the SOI substrate to extend through the buried insulating layer. The buried insulating layer then facilitates relaxation of the sacrificial stressor layer and the transfer of strain into the surface layer of the SOT substrate because the buried insulating layer is more compliant than silicon or other semiconductor materials. The comparatively compliant buried oxide layer is useful to obtain high levels of relaxation in the sacrificial stressor layer and high levels of strain in the silicon layer between the buried oxide layer and the sacrificial stressor layer.

In an alternate embodiment, the process etches trenches through the semiconductor layer and into the buried insulating layer and then laterally etches the buried insulating layer where exposed at the trenches so that the surface silicon regions are undercut. The undercut regions where the buried insulating layer is laterally etched facilitate the relaxation of the sacrificial stressor regions and the transfer of the stress to the surface silicon regions.

In an alternate implementation that may have important advantages in manufacturing, the sacrificial stressor may be formed of stressed silicon nitride. A thin film of silicon nitride may be deposited, for example by plasma enhanced chemical vapor deposition (PECVD), in a condition of either tensile or compressive stress as deposited. By varying input factors in the PECVD process, predictable amounts of either tensile or compressive built-in stress in the range 1.7 GPa tensile to 3.0 GPa compressive can be selectively incorporated in a deposited silicon nitride thin film. Silicon nitride may be preferred over epitaxial silicon germanium as a sacrificial stressor material for several reasons. Deposition of silicon nitride by PECVD is in general a lower cost process than growth of epitaxial silicon germanium on silicon. Stressed silicon nitride may be applied conveniently as a sacrificial stressor on a wide range of semiconductor substrates other than silicon including germanium, group III-V and group II-VI compound semiconductors. Silicon nitride can be deposited in a state of either tensile or compressive stress which allows a process to induce either compressive or tensile strain in the underlying semiconductor, respectively. In addition to serving the role of sacrificial stressor, the silicon nitride can be used as a hard mask for patterning trenches by plasma etch processes. The silicon nitride may also be used conveniently as the polish stop layer when planarizing the trench fill material by chemical mechanical polishing CMP.

Whatever material is selected for the sacrificial stressor layer, preferred processes can select and independently control the relative amounts of stress directed along each of the primary axes of a semiconductor device, for example, corresponding to the width axis and length axis of a MOSFET. The amount of stress directed along different axes may be controlled independently through the spacing of the isolation trenches determined by the layout of the mask used to define the active area of the devices. Where in-plane stress is not desired in the semiconductor along a particular axis in a semiconductor device, the trenches preferably are spaced sufficiently far apart along that axis such that the effect of the edge relaxation mechanism is suitably minimized. Conversely, where in-plane stress is desired in the semiconductor along a particular axis in a semiconductor surface portion, the trenches preferably are spaced sufficiently close together along that axis so the effect of the edge relaxation mechanism is suitably maximized. The isolation trenches subsequently are filled with a suitable insulator using any of the shallow trench isolation (STI) fill processes already well established in the CMOS IC industry or that may be introduced in the future. Preferably the trench fill is performed to maintain the desired stress properties of adjacent active regions.

In-plane tensile stress can be created in active regions of a thin layer of silicon by having an in-plane compressive stress in an overlying sacrificial compressive stressor layer and etching closely-spaced isolation trenches through both layers and into the substrate below the surface layer of silicon. The trenches preferably are etched deep enough to ensure that the sacrificial layer with compressive stress is able to relax laterally by elastic edge relaxation. For implementations using SOI substrates, the trench depth will generally extend through the buried insulating layer. Consequently the stress is reduced in the sacrificial stressor layer in proximity to the isolation trenches and tensile stress is induced in the below silicon layer in proximity to the isolation trenches. Trench fill is used to stabilize the strain within the silicon layer and then the sacrificial stressor layer preferably is removed. Preferably, comparatively stiff insulating materials are used to fill the trenches as this better stabilizes the strain in the surface silicon layer. After filling the isolation trenches and etching to remove the sacrificial stressor layer, the regions of isolated silicon on top can be used to fabricate devices such as MOS transistors and strained SOI MOS transistors. This is readily achieved with appropriate stresses and geometry according to the present invention. As such, the method permits the fabrication of strained MOS devices and strained MOS SOI devices with potentially low cost and low defect counts compared to conventional methods.

The tensile strain induced into the top silicon layer by this method may in general be non-uniform in its distribution but is of sufficient magnitude to improve the in-plane electron and hole mobilities to a desirable extent and hence to improve the electrical performance of MOS transistors having channels at least in part formed in the layer.

Figure 2:
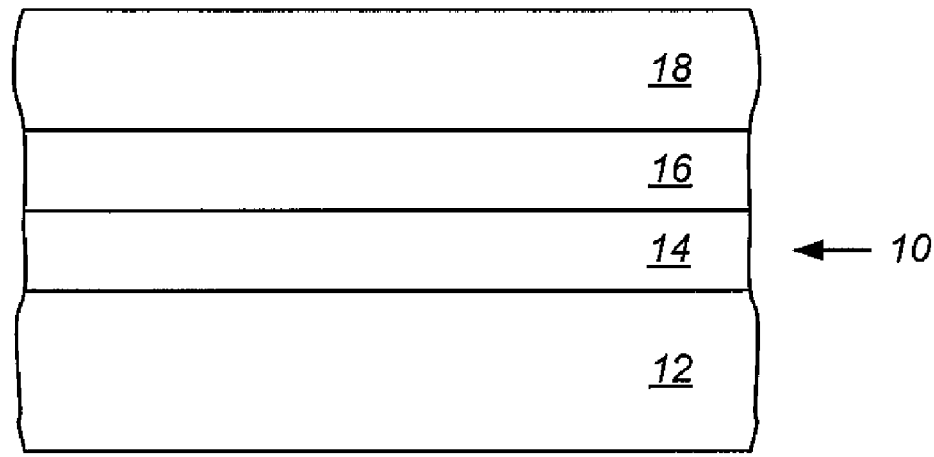

FIGS. 1-5 illustrate aspects of preferred process implementations of the present invention. FIG. 1 shows a substrate 10, which is shown in this example as a silicon on insulator substrate having a silicon base 12, a buried silicon oxide layer 14 and a surface silicon layer 16. Appropriate SOI substrates 10 are commercially available or can be made using known techniques. In a preferred SOI substrate 10, the surface silicon layer 16 may be approximately 3 nanometers to approximately 200 nanometers thick and the buried oxide layer 14 may be approximately 5 nanometers to approximately 500 nanometers thick. Preferably, a sacrificial stressor layer 18 is deposited on the substrate 10, as shown in FIG. 2. An appropriate sacrificial stressor layer 18 might be silicon germanium with a germanium concentration of approximately 20% to 50%. The silicon germanium sacrificial stressor layer 18 can be deposited by chemical vapor deposition to a thickness of approximately 5 nanometers to 15 nanometers. Sacrificial silicon germanium stressor layer 18 is deposited in a state of compressive stress due to the in-plane lattice mismatch between the silicon germanium and the underlying silicon layer.

Generally, a silicon germanium stressor layer 18 applies a maximum stress to an underlying silicon layer when the silicon germanium stressor layer 18 has a thickness at or near the critical thickness for that germanium concentration. It is consequently preferable to make a silicon germanium sacrificial stressor layer 18 have a thickness at or less than the critical thickness for that composition of silicon germanium. A variety of germanium concentrations are useful for this sacrificial silicon germanium layer, with increasing germanium concentrations having higher levels of compressive stress as formed and applying greater stresses to the silicon surface layer 16 after etching and relaxation of the sacrificial stressor layer.

Typically, it is useful to use a substantial germanium concentration to provide a desirable level of stress to the silicon surface layer. For example, the sacrificial silicon germanium layer 18 might have a germanium concentration of approximately 20% to 50% or more.

Figure 3:
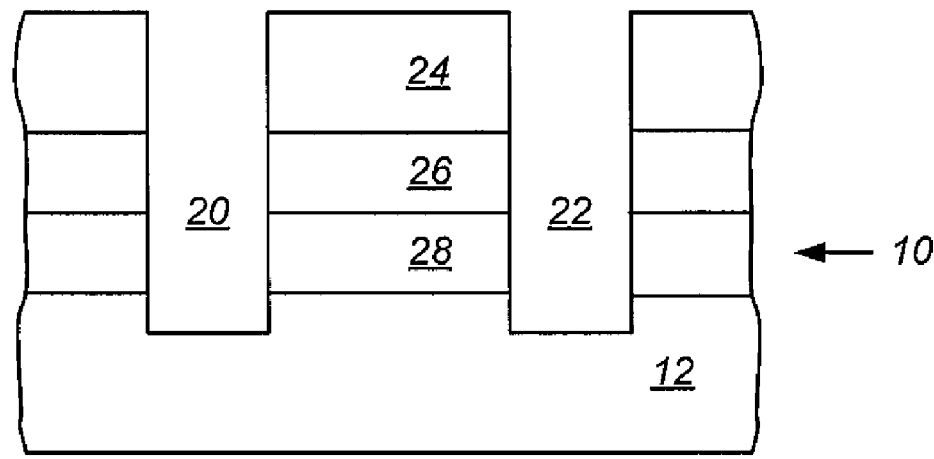

Following deposition of the silicon germanium layer 18 as illustrated in FIG. 2, a preferred process continues by etching trenches 20, 22 through the layers 18 and 16 and through the buried oxide layer 14 to or into the silicon base portion 12 of the substrate 10. The end result of this process is illustrated in FIG. 3. The illustrated trenches 20, 22 can be formed using the processing typically used for shallow trench isolation (STD, to the extent the trenches are etched through a silicon portion of a substrate. An oxide etching process is added to the conventional trench etching process to etch through the buried oxide layer. Thus, the trench etch proceeds through the silicon surface layer 16 (FIG. 2) to reach the buried oxide layer 14, forming the sacrificial stressor region 24 and the surface silicon region 26 as shown in FIG. 3. Etching then proceeds through the buried oxide layer 14 before, optionally, the etching continues into the thicker silicon substrate 12 to define the oxide region 28. In some implementations, the process for etching trenches then laterally etches the buried insulating layer where exposed at the trenches so that the surface silicon regions 26 are undercut. The undercut regions where lateral portions of the buried insulating region 28 are removed facilitate the relaxation of the sacrificial stressor region 24 and the transfer of the stress to the surface silicon region 26. The lateral undercut etch may be accomplished, for example, using an anhydrous HF etching process.

The sidewalls of the trenches 20, 22 define a portion 24 of the sacrificial stressor layer over a corresponding portion 26 of the silicon surface layer. In the illustrated embodiment, the trenches extend into the buried silicon oxide layer and define a buried oxide region 28 having a width substantially the same as the overlying silicon region 26 and silicon germanium region 24. Each of the regions 24, 26 and 28 extend between the sidewalls of trenches 20 and 22. As discussed above, etching the trenches most preferably allows the sacrificial stressor layer 24 to relax and to transfer a portion of its stress into tensile stress within the silicon surface layer 26. For the illustrated preferred embodiment in which the trenches 20, 22 extend through the buried oxide layer of the substrate 10, a portion of the stress from the stressor layer is also transferred to and relaxed through the buried oxide region 28. The greater compliance of the buried oxide region 28 as compared to the silicon surface region 26 ensures that more of the stress from the silicon germanium region 24 will be transferred to and remain within the silicon surface region 26.

In an alternative implementation the sacrificial stressor may be a structure consisting of or including a layer of silicon nitride, which can be deposited conveniently by a chemical vapor deposition (CVD) method under conditions which give rise to built-in stress. Such deposition conditions are well known in the silicon IC processing industry. For example, Applied Materials reports that its Producer Celera system for plasma-enhanced CVD (PECVD) offers an integrated stress silicon nitride deposition and UV cure solution which delivers tensile stress of up to 1.7 GPa, with extendibility to 2.0 GPa, while meeting low thermal budget requirements. The same deposition chamber can deposit silicon nitride films with compressive stresses up to 3.5 GPa. If it is desired to have an in-plane tensile stress induced in the semiconductor, a sacrificial silicon nitride stressor with built-in compressive stress preferably is selected. If alternatively it is desired to have an in-plane compressive stress induced in the semiconductor, a sacrificial silicon nitride stressor deposited with built-in tensile stress preferably is selected.

The distribution of strain in the various layers following trench formation is inhomogeneous and the final strain distribution is strongly dependent on the geometry of the layered structures, the separation of opposing trenches, and the depth and widths of the trenches. The illustrated trenches may be different portions of a network of trenches, portions of continuous trenches or may be two distinct trenches. For ease of discussion, wall surfaces of a continuous trench or distinct trenches will all be referenced here as distinct walls.

Figure 4:
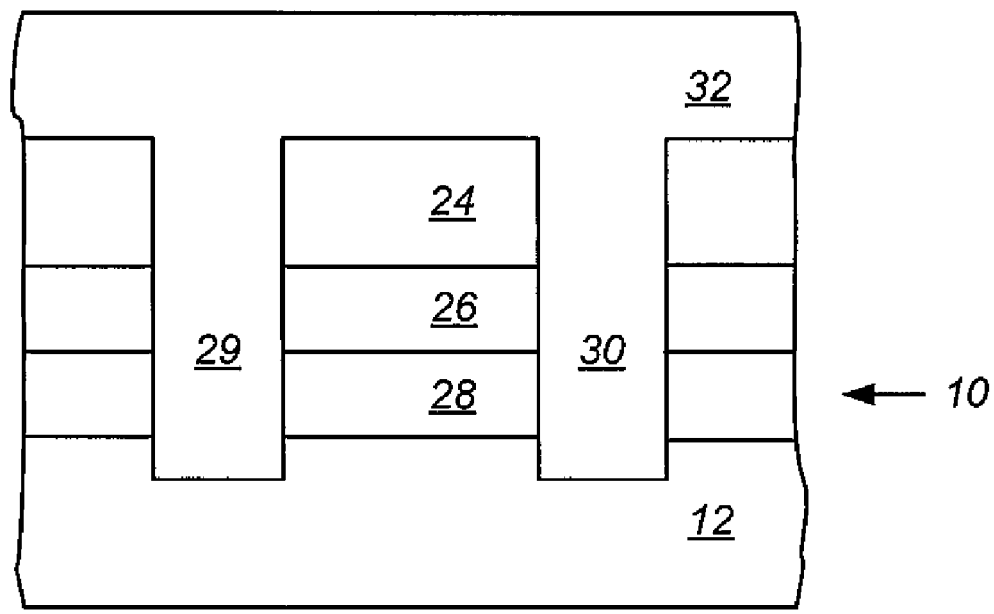

One consideration in determining the strain within a completed device is the material used to fill the etched trenches and the processes for etching and for filling the trenches. In most conventional STI CMOS processes, the trench is first lined with a thermal or other oxide and then fill material (typically silicon dioxide) is deposited and, in some cases, annealed. This is generally illustrated in FIG. 4. Due to the higher density and stiffer oxide formed, it may be desirable for the fill material deposited after the initial liner oxide layer to be deposited using high density plasma chemical vapor deposition. When used in the system as illustrated here, the insulating regions 29, 30 will tend to maintain at least some of the strain within the silicon surface region 26 that is transferred from the sacrificial stressor region 24 following trench formation. Overall, it is desired the net strain in the illustrated active silicon surface layer 26 will be tensile.

Alternatively it may be preferable for the fill material deposited after the initial liner oxide layer to be deposited using tetra ethyl ortho-silicate (TEOS) as a source material to form a layer of silicon dioxide that is subsequently densified by thermal annealing according to standard procedures well known in the industry. Annealed TEOS trench fill generally gives rise to additional tensile strain in the system which is applied laterally to the active layer or silicon surface region 26. When used in the system as illustrated here, the tensile stress applied by the insulating regions 29, 30 will tend to work to supplement the desired tensile strain in the active silicon.

Figure 5:
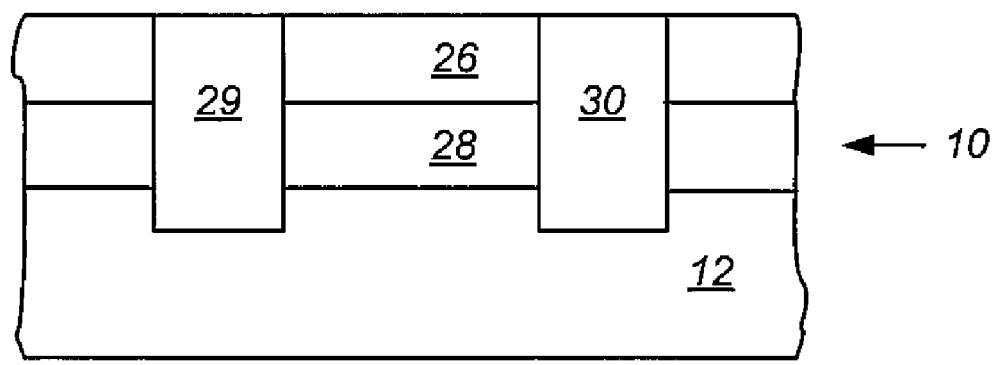

Following fill of the trenches, it is preferred that processing continues to complete definition of the shallow trench isolation (STI) structures. This is typically performed by chemical mechanical polishing the excess surface layer 32 of fill material to remove the fill material and planarize the surface of the workpiece. The chemical mechanical polishing process may use the silicon germanium regions 26 as a polish stop. More typically, a patterned silicon nitride layer might be used as both a trench mask and as a polish stop layer for this process. Following polishing to remove the excess portions of the layer 32, preferred implementations remove the remaining portion of the silicon germanium sacrificial stressor region 24. For example, a mixture of hydrofluoric acid (HF), hydrogen peroxide ($H_2O_2$), and acetic acid ($CH_3COOH$) may be used to selectively remove silicon germanium layers from a substrate with a silicon surface at selectivities of 300:1 or more. Additional etching may be required to adjust the surface of the insulating material 29, 30 filling the trenches so that the remaining insulating material has a desired height, which typically leaves the upper surfaces of the insulating material 29, 30 within the trenches substantially planar with the remaining portions of the silicon surface regions 26. The resulting structure is illustrated in FIG. 5. In this structure the stress originally applied to the surface regions 26 by the sacrificial stressor layer is stabilized or maintained by the trench isolation structures 29, 30.

Figure 6:
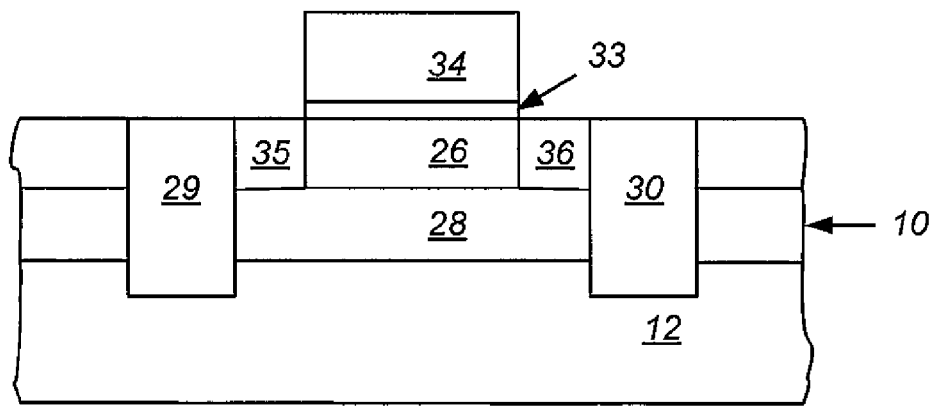
FIG. 6 illustrates a MOS field effect transistor manufactured according to preferred aspects of the present invention.

Further processing is preferably performed to form n-MOSFETs and, as desired, p-channel MOSFETs (p-MOS- FET) and CMOS circuitry. An example of a MOS device is illustrated in FIG. 6. As shown, the buried oxide region 28 is provided over the substrate 12 and the strained silicon surface region 26 is provided over the buried oxide region 28. For the illustrated n-MOSFET, gate dielectric 33 separates gate electrode 34 from the p-type strained silicon surface region 26. n-type source and drain electrodes 35, 36 are provided adjacent either end of the region 26 so that the silicon surface layer 26 acts completely or at least partially as the channel region of the illustrated n-MOSFET.

Figure 7:
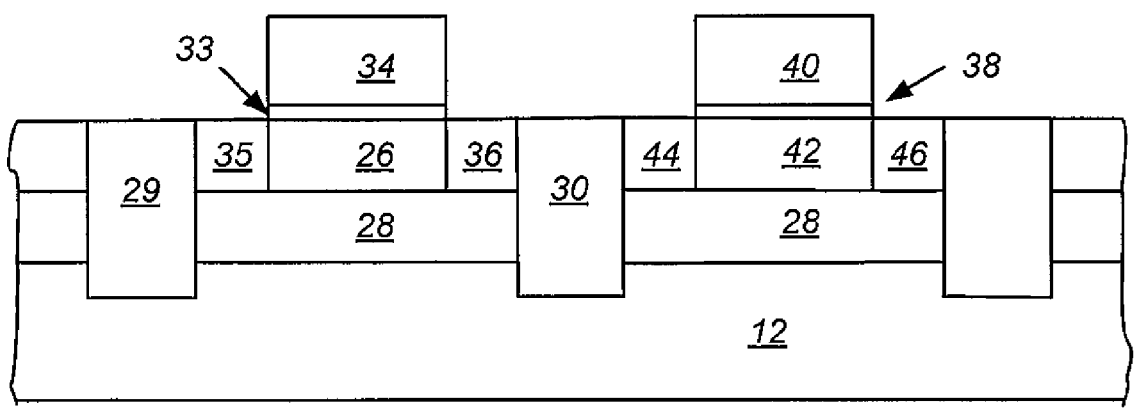
FIG. 7 illustrates a CMOS device manufactured according to preferred aspects of the present invention.

The n-MOSFET device of FIG. 6 is preferably combined with a p-MOSFET in the illustrated FIG. 7 CMOS device. The n-MOSFET is shown on the left hand side of the FIG. 7 structures and like or similar structures within the FIG. 7 illustration are identified with the same reference numbers that are used in FIG. 6. For the p-MOSFET portion of the CMOS device, shown on the right, gate dielectric 38 separates gate electrode 40 from the n-type strained silicon surface layer 42. The n-type strained silicon surface region 42 has tensile strain applied in the same process as described above with respect to the substrate shown in FIG. 5. Additional stresses or strain engineering may also be used in combination with the stress achieved in the processes illustrated in FIGS. 1-5. Because stresses are additive, such strain engineering can yield a uniaxial strained channel region within the silicon surface region 42 for the p-channel device. p-type source and drain electrodes 44, 46 are provided on either end of the layer 42 so that the silicon surface layer 42 acts completely or at least partially as the channel region of the illustrated p-MOSFET device.

Another consideration is the different impact that the in-plane stress components have on carrier mobilities. For electrons (in n-MOSFETs) it is generally understood that tensile strain is desirable along both the length and width axes of n-MOSFETs that are aligned along <110> axes of a {100} oriented substrate. That is, for n-MOSFETs, the piezoelectric coefficients are such that mobility increases with biaxial tensile strain. However, for holes, tensile strain is only desirable along the width axis for a similarly oriented p-MOSFET and uniaxial compressive strain is desirable along the length axis in such a p-MOSFET. This has led to the use of selectively grown silicon-germanium (SiGe) inserts in the source and drain regions of p-MOSFETs to induce the desired uniaxial compressive strain in the silicon channel region.

Alternative implementations of the present invention can provide uniaxial compressive stress in the top silicon layer directed along the length of the channel in a p-MOSFET while still obtaining a tensile strain in the width direction of the p-MOSFET channel. Preferred implementations may beneficially use the technique of applying compressive stress in the p-channel by growing layers of epitaxial silicon germanium selectively in recesses in the source and drain regions of the p-MOSFET. Since stresses are superimposed linearly, the net effect of this action is the same as in conventional compressed silicon germanium source/drain implementations. Thus selective silicon germanium source and drain insert technology may be applied efficiently in implementations of the present invention to induce a uniaxial compressive stress along the length of a p-MOSFET in much the same way as silicon germanium source and drain stressors are applied in bulk silicon CMOS technology.

Alternately, where in-plane stress is not desired in the semiconductor along a particular axis in a semiconductor device, the trenches along that axis may be etched and filled after the removal of the sacrificial stressor layer, while trenches along a particular axis for which stress is desired may be etched and filled prior to the removal of the sacrificial stressor layer.

In an alternate process, trenches may be formed before the sacrificial stressor layer is formed. In this implementation, the trenches are formed according to conventional strategies using either a bulk or SOI substrate. After opening the trenches, this implementation preferably fills the trenches with a compliant material, for example silicon oxide deposited from a TEOS (tetra-ethyl-ortho-silicate which is a well known precursor in the semiconductor industry for deposition of semiconductor dioxide films) source. This implementation continues by removing any excess fill material so that the remaining surface of the fill material is approximately planar with the tops of the exposed active semiconductor regions. Then the implementation selectively deposits the sacrificial stressor material on the semiconductor islands that remain after trenching. Preferably this alternate process deposits the sacrificial stressor material preferentially so that it is only formed on the exposed surfaces of the semiconductor islands. For example, appropriate selective deposition techniques are known in the art to deposit silicon germanium on exposed silicon surfaces, when those materials are selected. Appropriate selective deposition techniques are known for other substrates and sacrificial layers as well.

Because at this stage in this alternative implementation the trench fill material is somewhat compliant, edge relaxation at the trench sidewalls will allow the stressor film to partially relax close to the trenches and induce strain in the semiconductor islands on which MOSFETs or other devices will be constructed. The in-plane strain in the semiconductor will be tensile if the stressor material is under in-plane compressive stress. The in-plane strain in the semiconductor will be compressive if the stressor material is under in-plane tensile stress. After this, this alternate implementation densifies the deposited material so that it will hold the induced stress in the semiconductor layer when the sacrificial stressor layer is removed. Then, as in the previous method, this alternate implementation removes the sacrificial layer, leaving the strained semiconductor, now stressed, upon which MOSFETs or other devices can be built.

This alternative implementation may induce comparatively more strain in the semiconductor layer in which transistors or other devices are constructed than the first method, depending on the configuration of the trenches and the specific characteristics of the sacrificial stressor layer.

Another alternate method is referenced as here as the third implementation. The third implementation creates trenches before the depositing the sacrificial stressor layer. After this, the third implementation fills the trenches with a sacrificial material that preferably has two properties: that it can later be removed selectively by etching without harm to the semiconductor; and that the stressor material can be selectively deposited on the semiconductor and not on the fill material. Following filling the trenches with the sacrificial material, the third implementation removes any excess fill material so that the remaining surface of the fill material is approximately planar with the tops of the exposed active semiconductor regions. Then the third implementation selectively deposits the sacrificial stress material on the exposed semiconductor islands that remain after trenching. Next, the third implementation removes the temporary sacrificial trench fill material. This will cause strain to be induced in the semiconductor by elastic edge relaxation of the stressor material. The induced in-plane strain in the semiconductor will be tensile if the stressor material is under in-plane compressive stress. The in-plane strain in the semiconductor will be compressive if the stressor material is under in-plane tensile stress. Next, the third implementation fills the trench with a material that is as stiff (non-compliant) as can be achieved by any known trench fill process. Then, as in previous methods, the third implementation removes the sacrificial stressor layer, leaving the semiconductor, now strained at its surface, upon which MOSFETs or other devices can be built.

This third implementation is particularly preferred when it is desired that the fill material be selected to have the maximum stiffness so as to retain the maximum amount of the strain induced in the semiconductor.

Preferred implementations according to the above methods uses silicon-on-insulator as the semiconductor and epitaxial silicon germanium alloy as the preferred stressor layer. In this preferred strategy, the stressor layer may have a germanium fraction in the range of 20% to 100% and a thickness of less than or equal to a critical thickness for generation of dislocations. The preferred silicon germanium stressor layer is under compressive stress; in-plane tensile strain is induced in the silicon island by the sacrificial silicon germanium stressor layer. Most preferably, the trenches are etched into or beyond the buried insulator layer. The trench fill material preferably is selected to be sufficiently non-compliant such that some amount of tensile strain remains in the surface of the silicon island after the sacrificial silicon germanium stressor layer is removed. Selective wet and dry etches are known for the preferential removal of the silicon germanium stressor layer, leaving the silicon layer underneath unetched and undamaged. As an example, a mixture of hydrofluoric acid (HF), hydrogen peroxide ($H_2O_2$), and acetic acid ($CH_3COOH$) can selectively etch silicon germanium layers from a silicon surface of a substrate at selectivities of 300:1 or more.

Other preferred implementations may used germanium-on-insulator as the semiconductor and epitaxial silicon germanium alloy as the preferred stressor layer. In these preferred implementations, the stressor layer preferably has a germanium fraction in the range 0% to 80% and a thickness of less than or equal to a critical thickness for generation of dislocations. The silicon germanium stressor layer is under tensile stress and in-plane compressive strain is induced in the underlying germanium islands. Preferably, the trenches are etched to a depth sufficient to penetrate the buried insulator layer. The trench fill material is selected to be sufficiently non-compliant such that some amount of tensile strain remains in the surface of the germanium island after the sacrificial silicon germanium stressor layer is removed. Preferably a known selective wet or dry etches or other wet or dry etches are used to remove the SiGe stressor layer, leaving the germanium layer underneath unetched and undamaged.

The present invention has been described in terms of certain preferred embodiments. Those of ordinary skill in the art will appreciate that various modifications and alterations could be made to the specific preferred embodiments described here without varying from the teachings of the present invention. Consequently, the present invention is not intended to be limited to the specific preferred embodiments described here but instead the present invention is to be defined by the appended claims.

We claim:

1. A method of manufacturing a semiconductor device, comprising:
   providing a substrate having a semiconductor surface region, wherein the substrate is a semiconductor on insulator substrate having a buried insulator layer; and
   forming a sacrificial stressor layer over the semiconductor surface region, the sacrificial stressor layer formed in a stressed state in comparison to the semiconductor surface region;
   etching trenches through the sacrificial stressor layer and through at least a portion of the semiconductor surface region and into the substrate at least to the buried insulator layer so that a patterned region of the sacrificial stressor layer induces strain in a corresponding patterned region of the semiconductor surface region to provide a strained semiconductor surface region defined laterally on at least two sides by trench walls;
   filling the trenches to maintain and maintaining at least a portion of the transferred stress within the strained semiconductor surface region; and
   removing remaining portions of the sacrificial stressor layer after the filling.

2. The method of claim 1, wherein the semiconductor on insulator substrate is a silicon on insulator substrate.

3. The method of claim 2, wherein the sacrificial stressor layer is silicon germanium.

4. The method of claim 2, wherein the sacrificial stressor layer is silicon germanium having a germanium concentration of between 20 to 50%.

5. The method of claim 1, wherein the sacrificial stressor layer is silicon germanium having a germanium concentration of between 20 to 50%.

6. The method of claim 1, wherein the sacrificial stressor layer is silicon nitride having a built-in compressive stress as-deposited.

7. The method of claim 1, wherein the sacrificial stressor layer is silicon nitride having a built-in tensile stress as-deposited.

8. A method of manufacturing a semiconductor device, comprising:
   providing a substrate having a semiconductor surface region, wherein the substrate is a silicon on oxide substrate having a buried oxide layer,
   forming a sacrificial stressor layer over the semiconductor surface region, the sacrificial stressor layer formed in a stressed state in comparison to the semiconductor surface region;
   etching trenches through the sacrificial stressor layer and through at least a portion of the semiconductor surface region so that a patterned region of the sacrificial stressor layer induces strain in a corresponding patterned region of the semiconductor surface region to provide a strained semiconductor surface region defined laterally on at least two sides by trench walls;
   filling the trenches and maintaining at least a portion of the transferred stress within the strained semiconductor surface region;
   removing remaining portions of the sacrificial stressor layer after the filling; and
   forming a field effect transistor on the strained semiconductor surface region, the field effect transistor having a gate, at least a portion of the strained semiconductor surface region positioned between the buried oxide layer and the gate.

9. The method of claim 8, wherein the etching extends through the buried oxide layer.

10. The method of claim 9, wherein the sacrificial stressor layer is silicon germanium.

11. The method of claim 9, wherein the sacrificial stressor layer is silicon germanium having a germanium concentration in a range of 20 to 50%.

12. The method of claim 9, wherein the filling provides a liner layer of oxide over the walls of the trenches and deposits additional fill material to fill the trenches.

13. The method of claim 12, wherein the sacrificial stressor layer is deposited in a state of compressive stress and wherein the semiconductor surface region has tensile strain after the removing.

14. The method of claim 13, wherein the sacrificial stressor layer is silicon germanium.

15. The method of claim 13, wherein the sacrificial stressor layer is silicon nitride deposited in a state of compressive stress.

16. The method of claim 14, wherein the field effect transistor is a p-channel field effect transistor and the gate is provided over a portion of the semiconductor surface layer having lateral tensile strain in at least one direction.

17. The method of claim 16, wherein the lateral strain is in the width axis of the p-channel field effect transistor.

18. The method of claim 12, further comprising annealing the additional fill material in a manner that the annealed additional fill material applies lateral stress to the surface semiconductor region.

19. The method of claim 18, wherein the additional fill material is deposited from a TEOS source.

20. The method of claim 8, further comprising laterally etching the buried insulator layer to undercut the surface semiconductor region, thereby further relaxing the surface semiconductor layer.

21. The method of claim 20, wherein the surface semiconductor region is silicon and the substrate below the buried oxide layer is silicon.

22. The method of claim 20, wherein the surface semiconductor region consists essentially of silicon and the substrate below the buried oxide layer consists essentially of silicon.

23. The method of claim 20, wherein the filling deposits fill material to at least in part fill the trenches followed by annealing the fill material in a manner that the annealed fill material applies lateral stress to the surface semiconductor region.

24. The method of claim 1, wherein the filling deposits fill material to at least in part fill the trenches followed by annealing the fill material in a manner that the annealed fill material applies lateral stress to the surface semiconductor region.

25. The method of claim 24, wherein the additional fill material is deposited from a TEOS source.

26. A method of manufacturing a semiconductor device, comprising:
providing a substrate comprising silicon having a semiconductor surface region comprising silicon; and
etching trenches into the semiconductor surface region to define semiconductor surface islands;
selectively depositing a sacrificial stressor layer on the semiconductor surface islands and not over at least some portions of the trenches, the sacrificial stressor layer inducing lateral strain the semiconductor surface islands;
filling the trenches to maintain at least a portion of stress strain within the strained semiconductor surface islands; and
removing the sacrificial stressor layer from above the semiconductor surface islands maintaining strain in the semiconductor surface islands.

27. The method of claim 26, wherein the sacrificial stressor layer is under compressive stress.

28. The method of claim 26, wherein the sacrificial stressor layer comprises selectively epitaxially grown silicon germanium having a germanium concentration of between 20 to 50%.

29. The method of claim 26, wherein the substrate is a silicon on oxide substrate having a buried oxide layer.

30. A method of manufacturing a semiconductor device, comprising:
providing a substrate having a semiconductor surface region, wherein the substrate is a silicon on oxide substrate having a buried oxide layer;
forming a sacrificial stressor layer over the semiconductor surface region, the sacrificial stressor layer formed in a compressive stressed state in comparison to the semiconductor surface region;
etching trenches through the sacrificial stressor layer and through at least a portion of the semiconductor surface region so that a patterned region of the sacrificial stressor layer induces strain in a corresponding patterned region of the semiconductor surface region to provide a strained semiconductor surface region defined laterally on at least two sides by trench walls;
filling the trenches and maintaining at least a portion of the transferred stress within the strained semiconductor surface region;
removing remaining portions of the sacrificial stressor layer after the filling; and
forming a p-channel field effect transistor on the strained semiconductor surface region, the field effect transistor having a gate, at least a portion of the strained semiconductor surface region positioned between the buried oxide layer and the gate, the portion of the strained semiconductor surface region having tensile strain in at least one lateral direction.

31. The method of claim 30, wherein the tensile strain is in the width axis of the p-channel field effect transistor.

32. The method of claim 30, wherein the sacrificial stressor layer is silicon germanium.

33. The method of claim 30, wherein the sacrificial stressor layer is silicon germanium having a germanium concentration of between 20 to 50%.

34. The method of claim 30, wherein the sacrificial stressor layer is silicon nitride having a built-in compressive stress as-deposited.

35. The method of claim 30, wherein the etching extends through a silicon surface layer into the substrate at least to the buried oxide layer.

36. The method of claim 6, wherein the semiconductor on insulator substrate is a germanium on insulator substrate.

* * * * *